(12) United States Patent
Jagannathan et al.

(10) Patent No.: US 9,530,651 B2
(45) Date of Patent: Dec. 27, 2016

(54) REPLACEMENT METAL GATE FINFET

(71) Applicant: International Business Machines Corporation, Armonk, NY (US)

(72) Inventors: Hemanth Jagannathan, Guilderland, NY (US); Sanjay C. Mehta, Niskayuna, NY (US); Junli Wang, Singerlands, NY (US); Chun-Chen Yeh, Clifton Park, NY (US); Stefan Schmitz, Ballston Spa, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/609,790

(22) Filed: Jan. 30, 2015

(65) Prior Publication Data

US 2015/0137244 A1    May 21, 2015

Related U.S. Application Data

(60) Division of application No. 13/672,899, filed on Nov. 9, 2012, now Pat. No. 9,153,447, which is a continuation of application No. 13/659,202, filed on Oct. 24, 2012, now Pat. No. 9,093,376.

(51) Int. Cl.
| | |
|---|---|
| *H01L 27/12* | (2006.01) |
| *H01L 21/28* | (2006.01) |
| *H01L 29/78* | (2006.01) |
| *H01L 29/66* | (2006.01) |

(52) U.S. Cl.
CPC ... *H01L 21/28132* (2013.01); *H01L 29/66545* (2013.01); *H01L 29/66795* (2013.01); *H01L 29/78* (2013.01); *H01L 29/785* (2013.01)

(58) Field of Classification Search
CPC .......................... H01L 29/78; H01L 21/28132
See application file for complete search history.

(56) References Cited

U.S. PATENT DOCUMENTS

| | | | |
|---|---|---|---|
| 6,391,782 | B1 | 5/2002 | Yu |
| 6,642,090 | B1 | 11/2003 | Fried et al. |
| 7,074,662 | B2 | 7/2006 | Lee et al. |
| 7,098,477 | B2 | 8/2006 | Zhu et al. |
| 7,211,446 | B2 | 5/2007 | Gaidis et |

(Continued)

OTHER PUBLICATIONS

Kawasaki et al., "Challenges and Solution of FinFET Integration in an SRAM Cell and a Logic Circuit for 22 nm node and beyond"j 2009 IEEE International Electron Devices Meeting (IEDM0, Dec. 7-9, 2009, pp. 12.1.1 through 12.1.4.

(Continued)

*Primary Examiner* — Jamie C Niesz
(74) *Attorney, Agent, or Firm* — Cantor Colburn LLP; Vazken Alexanian

(57) ABSTRACT

A field effect transistor device includes a fin including a semiconductor material arranged on an insulator layer, the fin including a channel region, a hardmask layer arranged partially over the channel region of the fin, a gate stack arranged over the hardmask layer and over the channel region of the fin, a metallic alloy layer arranged on a first portion of the hardmask layer, the metallic alloy layer arranged adjacent to the gate stack, and a first spacer arranged adjacent to the gate stack and over the metallic alloy layer.

1 Claim, 19 Drawing Sheets

(56) References Cited

U.S. PATENT DOCUMENTS

| | | | |
|---|---|---|---|
| 7,456,476 B2 | 11/2008 | Hareland et al. | |
| 7,545,008 B2 | 6/2009 | Chan et al. | |
| 7,947,589 B2 | 5/2011 | Muralidhar et al. | |
| 9,153,447 B2* | 10/2015 | Jagannathan | H01L 29/78 |
| 2007/0057325 A1* | 3/2007 | Hsu | H01L 29/785 |
| | | | 257/347 |
| 2008/0261385 A1 | 10/2008 | Jawarani et al. | |
| 2010/0071718 A1 | 3/2010 | Le et al. | |
| 2011/0057267 A1 | 3/2011 | Chuang et al. | |
| 2011/0237046 A1 | 9/2011 | Maszara et al. | |
| 2012/0244711 A1 | 9/2012 | Yin et al. | |
| 2013/0020657 A1* | 1/2013 | Lu | H01L 21/823842 |
| | | | 257/411 |
| 2013/0264652 A1 | 10/2013 | Zhu et al. | |
| 2013/0292805 A1 | 11/2013 | Cai et al. | |
| 2013/0302976 A1 | 11/2013 | Tsai et al. | |
| 2015/0137244 A1 | 5/2015 | Jagannathan et al. | |

OTHER PUBLICATIONS

Witters, et al., "Multiple-Vt FinFET devices through La2o3 dielectric capping", 2008 IEEE International SOI Conference Proceedings, pp. 121-122.

Zschatzsch et al., "Novel Approach to Conformal FinFET Extension Doping," 18th International Conference on Ion Implantation Technology IIT, Jun. 6-11, 2010, AIP Conference Proceedings, vol. 1321, pp. 1-2.

* cited by examiner

REPLACEMENT METAL GATE FINFET

DOMESTIC PRIORITY

This is a divisional application of U.S. application Ser. No. 13/672,899, filed on Nov. 9, 2012, which is a continuation application of U.S. application Ser. No. 13/659,202, filed on Oct. 24, 2012, the entire contents of which are incorporated herein by reference.

FIELD OF INVENTION

The present invention relates generally to field effect transistor (FET) devices, and more specifically, to FinFET devices.

DESCRIPTION OF RELATED ART

FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device.

Previous methods for patterning the fins included depositing or thermally growing a hardmask layer of an oxide material over a layer of semiconductor material and depositing a lithographic mask over the hardmask layer. The fins are formed by removing exposed portions of the hardmask layer and the semiconductor material resulting in an arrangement of fins having a hardmask layer arranged on the semiconductor material that is disposed on an insulator layer of the substrate.

A dummy gate stack may be formed by depositing a conformal dummy gate material over the hardmask layer the fins and the substrate. The dummy gate material is patterned using a lithographic etching process to define a dummy gate stack by removing portions of the dummy gate material to expose source and drain regions of the fins. The etching process that removes the dummy gate material removes portions of the hardmask material that protects the semiconductor material in the source and drain region of the fins. It is desirable for the hardmask layer to have a thickness great enough such that the hardmask layer is not completely removed from the source and drain regions of the fins during the patterning of the dummy gate stack. If the hardmask layer is removed or eroded during the dummy gate etching process, the underlying semiconductor material defining the fins may be exposed during the dummy gate etching process, which would result in the undesirable removal or lateral erosion of portions of the fins in the source and drain regions.

BRIEF SUMMARY

According to one embodiment of the present invention, a field effect transistor device includes a fin including a semiconductor material arranged on an insulator layer, the fin including a channel region, a hardmask layer arranged partially over the channel region of the fin, a gate stack arranged over the hardmask layer and over the channel region of the fin, a metallic alloy layer arranged on a first portion of the hardmask layer, the metallic alloy layer arranged adjacent to the gate stack, and a first spacer arranged adjacent to the gate stack and over the metallic alloy layer.

According to another embodiment of the present invention, a field effect transistor device includes a fin including a semiconductor material arranged on an insulator layer, the fin including a channel region, a gate stack arranged over the channel region of the fin, a hardmask layer arranged over a first portion of the fin adjacent to the gate stack, a metallic alloy layer arranged on the hardmask layer arranged over the first portion of the fin adjacent to the gate stack, and a first spacer arranged adjacent to the gate stack and over the metallic alloy layer.

According to yet another embodiment of the present invention, a field effect transistor device includes a fin including a semiconductor material arranged on an insulator layer, the fin including a channel region, a hardmask layer arranged over the channel region of the fin, a gate stack including a dielectric layer arranged over the hardmask layer and over the channel region of the fin, a first spacer arranged adjacent to the gate stack, and a first cavity defined by the hardmask layer, the first spacer and a source region arranged adjacent to the first spacer, wherein the first cavity is filled by the dielectric layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Previous methods for patterning a dummy gate stack over fins of a FinFET device included patterning fins that included a semiconductor and a hardmask layer disposed thereon. The dummy gate stack was formed by depositing a dummy gate material over the substrate, fins, and hardmask layer. The dummy gate stack was patterned using an etching process that removes portions of the dummy gate stack material. The semiconductor material of the fins was protected by the hardmask layer, which was deposited with a thickness such that portions of the hardmask layer would be removed during the patterning of the dummy gate stack, but some hardmask layer would remain on the fins to prevent an undesirable removal of the semiconductor material of the fins. Thus, the thickness of the hardmask layer was partially dependent on the thickness of the dummy gate stack material removed during the dummy gate stack patterning process.

As the aspect ratio or height of the dummy gate stack increases, the thickness of the hardmask layer likewise increases to accommodate the etching of a thicker layer of dummy gate stack material and protect the underlying fins. The use of a thicker hardmask material may become problematic and affect subsequent fabrication processes and the resultant FinFET devices. The methods and resultant structures described below provide for FinFET devices having a high aspect ratio gate structure, without the use of an undesirably thick hardmask layer.

Figure 1:
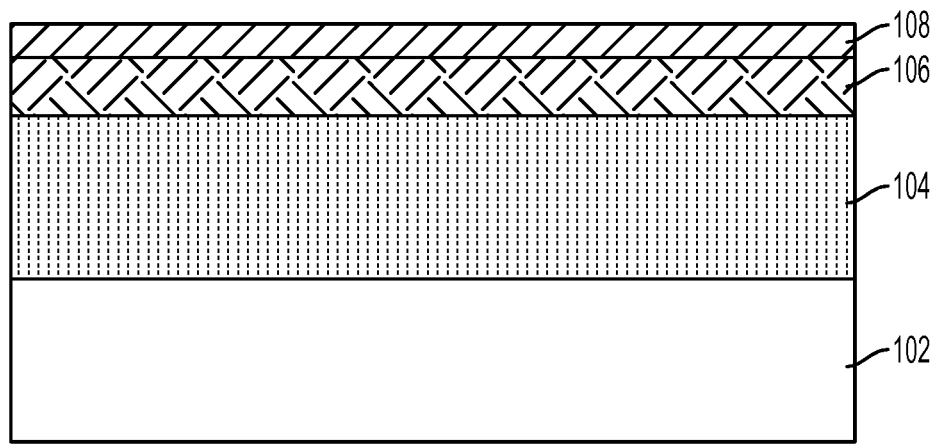
FIG. 1 illustrates a side view of an exemplary embodiment of a semiconductor-on-insulator (SOI) substrate.

FIG. 1 illustrates a side view of an exemplary embodiment of a semiconductor-on-insulator (SOI) substrate that includes an insulator layer 102 and a semiconductor layer 104 arranged thereon. The insulator layer 102 may include, for example a buried oxide (BOX) material. Alternate embodiments my include, an arrangement of the semiconductor devices described herein on a bulk substrate. The semiconductor material may include, for example, a silicon or germanium material. A hardmask layer 106 is disposed on the semiconductor layer 104. The hardmask layer 106 may include, for example, an oxide material. A metallic alloy layer 108 is disposed on the hardmask layer 106. The metallic alloy layer 108 may include, for example, a titanium nitride (TiN), TaN, TiSiN, TaSiN, AN, AlSiN, TaC, TiC, TiOx, AlxOy, HfOx, or HfSiOx.

Figure 2:
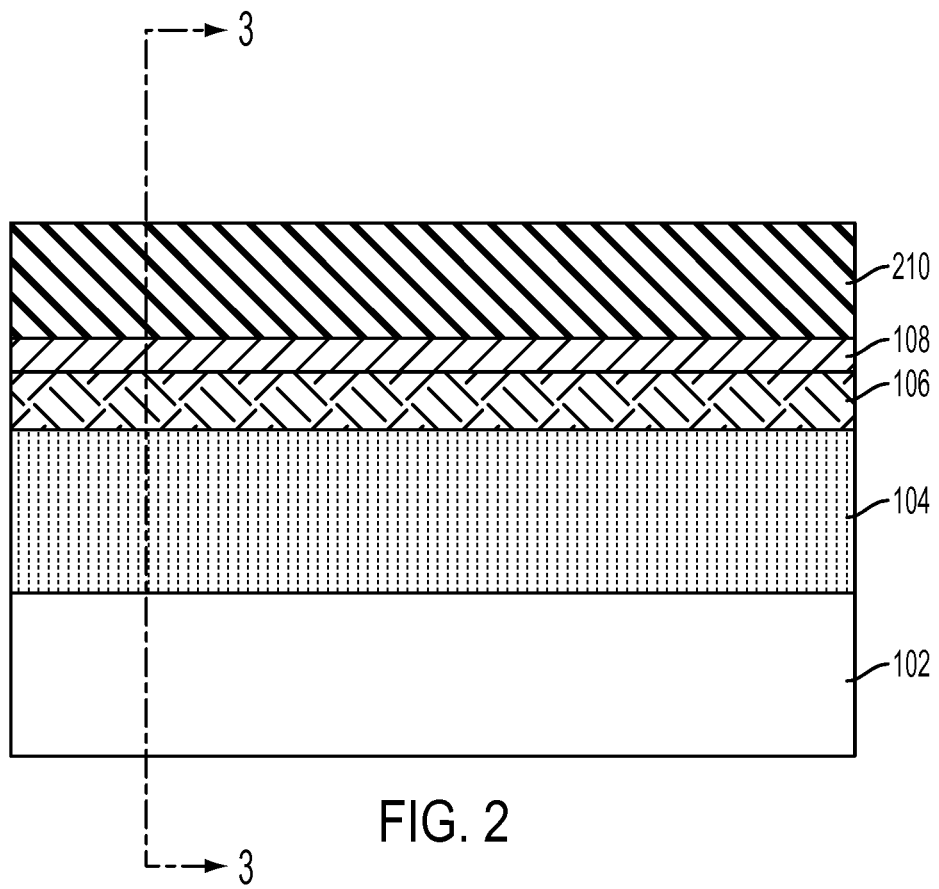
FIG. 2 illustrates the formation of a mandrel layer that is disposed on the metallic alloy layer.

FIG. 2 illustrates the formation of a mandrel layer 210 that is disposed on the metallic alloy layer 108. The mandrel material layer 210 may include, for example, amorphous silicon material or a silicon oxide material. The mandrel material layer 210 may be formed by, for example, a chemical vapor deposition (CVD) or plasma enhanced chemical vapor deposition (PECVD) process.

Figure 3:
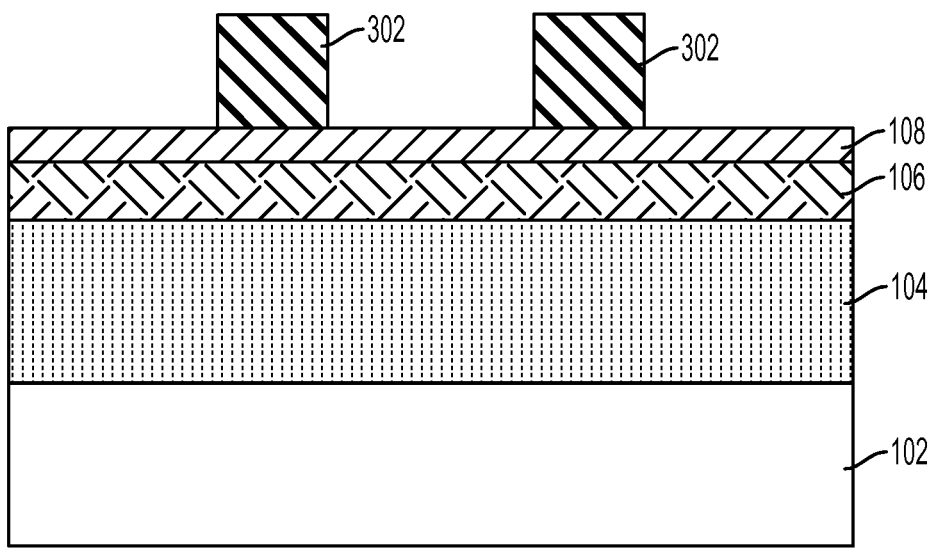
FIG. 3 illustrates a cut-away view along the line 3 (of FIG. 2).

FIG. 3 illustrates a cut-away view along the line 3 (of FIG. 2) of the resultant structure following a patterning and etching process that removes portions of the mandrel layer 210 using, for example, a photolithographic patterning and anisotropic etching process such as reactive ion etching (RIE) to form mandrels 302 that are arranged on the metallic alloy layer 108.

Figure 4:
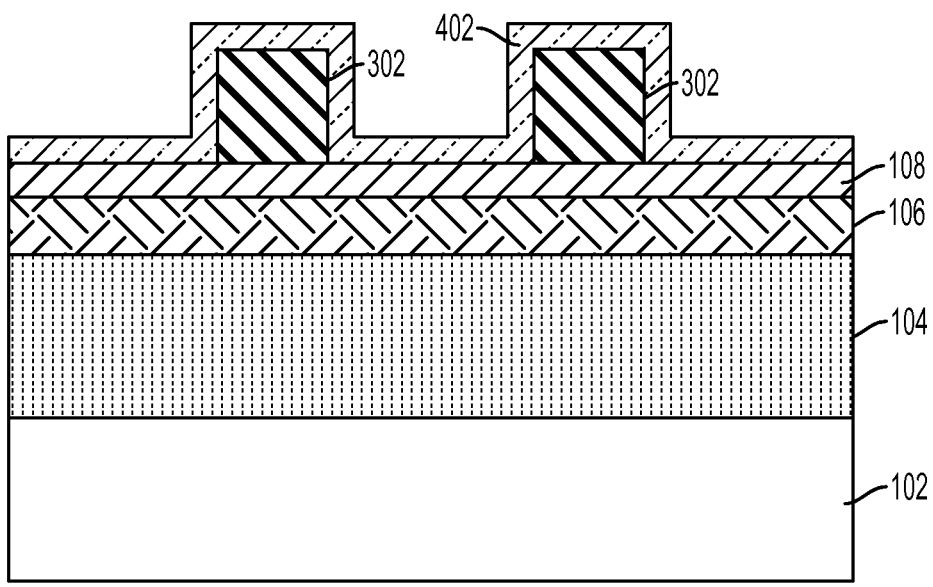
FIG. 4 illustrates the resultant structure following the deposition of a conformal layer of spacer material.

FIG. 4 illustrates the resultant structure following the deposition of a conformal layer of spacer material 402 over the mandrels 302 and exposed portions of the metallic alloy layer 108. The spacer material 402 may include, for example, a conformal oxide or nitride material.

Figure 5:
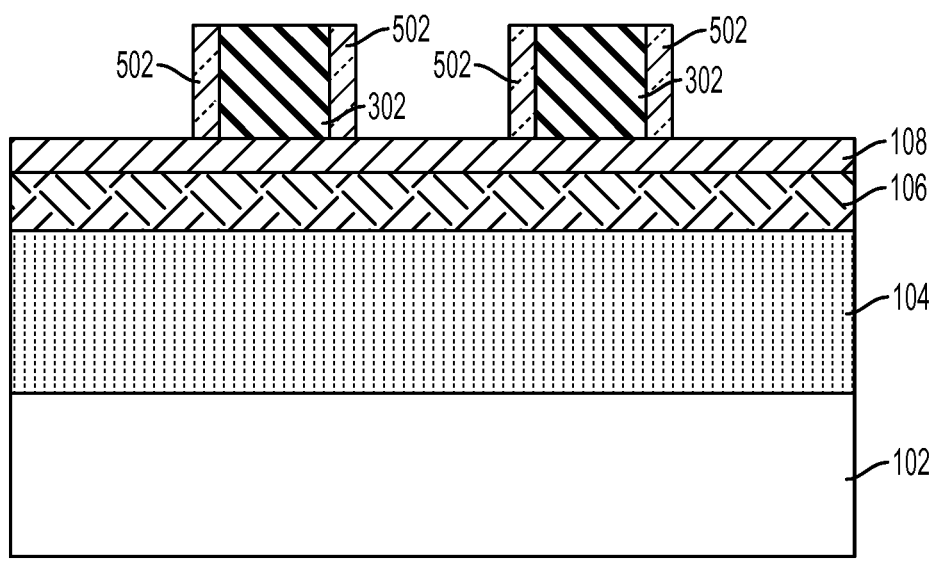
FIG. 5 illustrates the resultant structure following the removal of portions of the spacer material.

FIG. 5 illustrates the resultant structure following the removal of portions of the spacer material 402 that results in mandrel spacers 502. The mandrel spacers 502 may be formed by, for example, performing an anisotropic etching process that removes portions of the spacer material 402, but does not appreciably remove exposed portions of the metallic alloy layer 108 or the mandrels 302.

Figure 6:
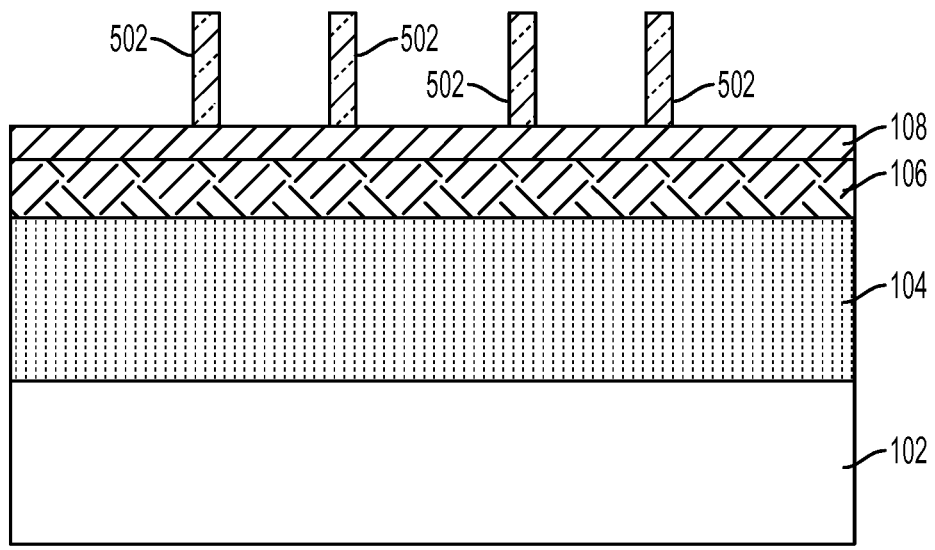
FIG. 6 illustrates the resultant structure following the removal of the mandrels.

FIG. 6 illustrates the resultant structure following the removal of the mandrels 302. The mandrels 302 may be removed by a suitable etching process that removes the mandrels 302, but does not appreciably remove the mandrel spacers 502 or the exposed portions of the metallic alloy layer 108.

Figure 7:
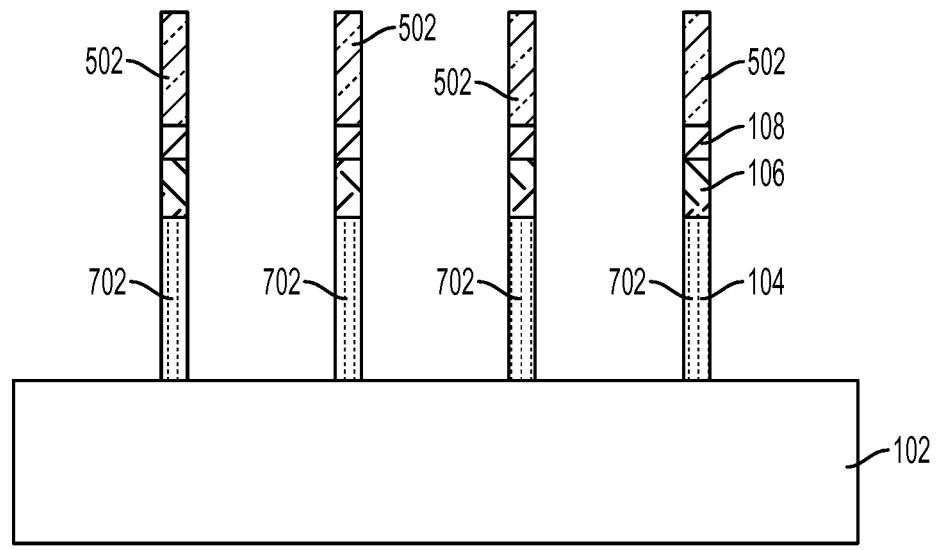
FIG. 7 illustrates the resultant structure following anisotropic etching process.

FIG. 7 illustrates the resultant structure following an isotropic etching process, such as for example RIE, to transfer the mandrel pattern into the metallic alloy layer 108, the hardmask layer 106, and the semiconductor material layer 104. The etching process is selective such that the mandrel spacers 502 are not appreciably removed, and that removes exposed portions of the metallic alloy layer 108, the hardmask layer 106, and the semiconductor material layer 104 to define semiconductor fins (fins) 702 arranged on the insulator layer 102.

Figure 8:
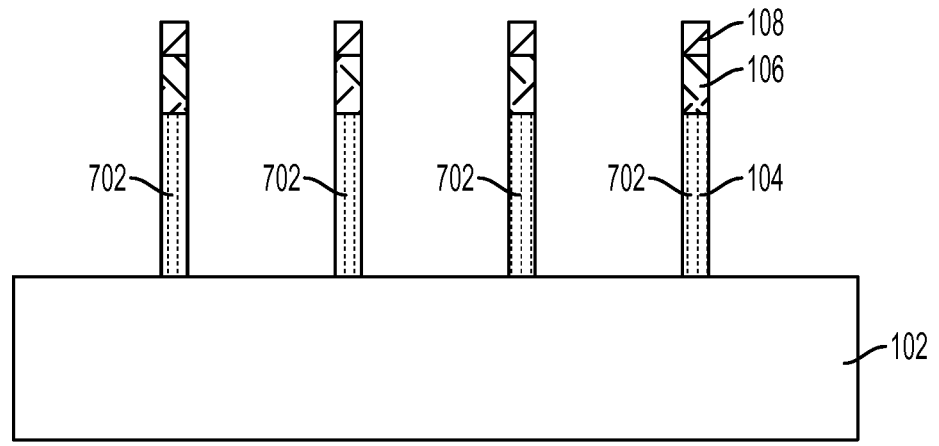
FIG. 8 illustrates the removal of the mandrel spacers.
Figure 9:
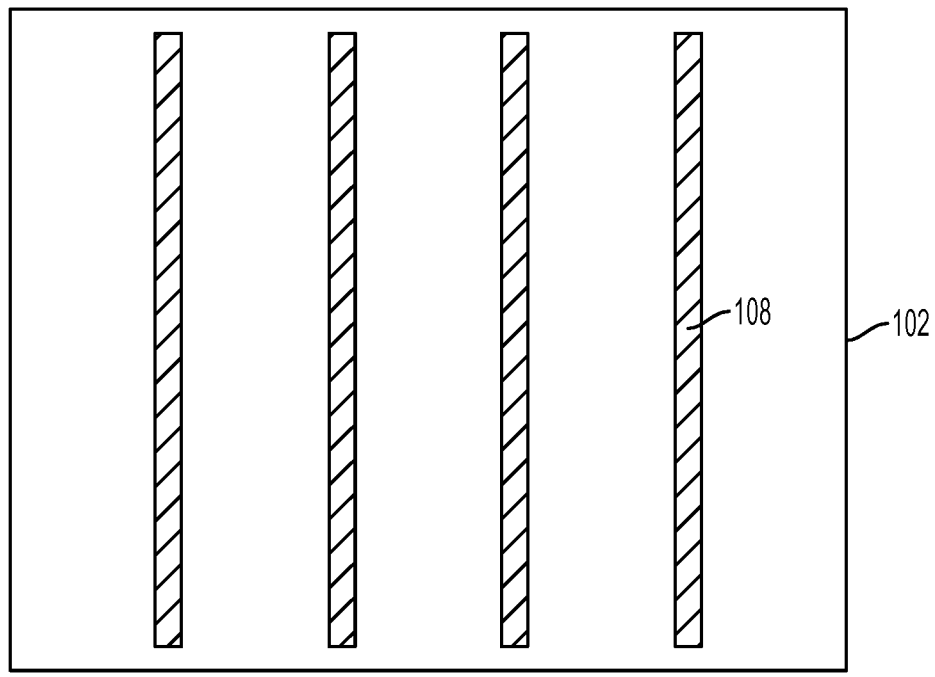
FIG. 9 illustrates a top view of FIG. 8.

FIG. 8 illustrates the removal of the mandrel spacers 502 (of FIG. 7), which exposes the metallic alloy layer 108. FIG. 9 illustrates a top-view of FIG. 8.

Figure 10:
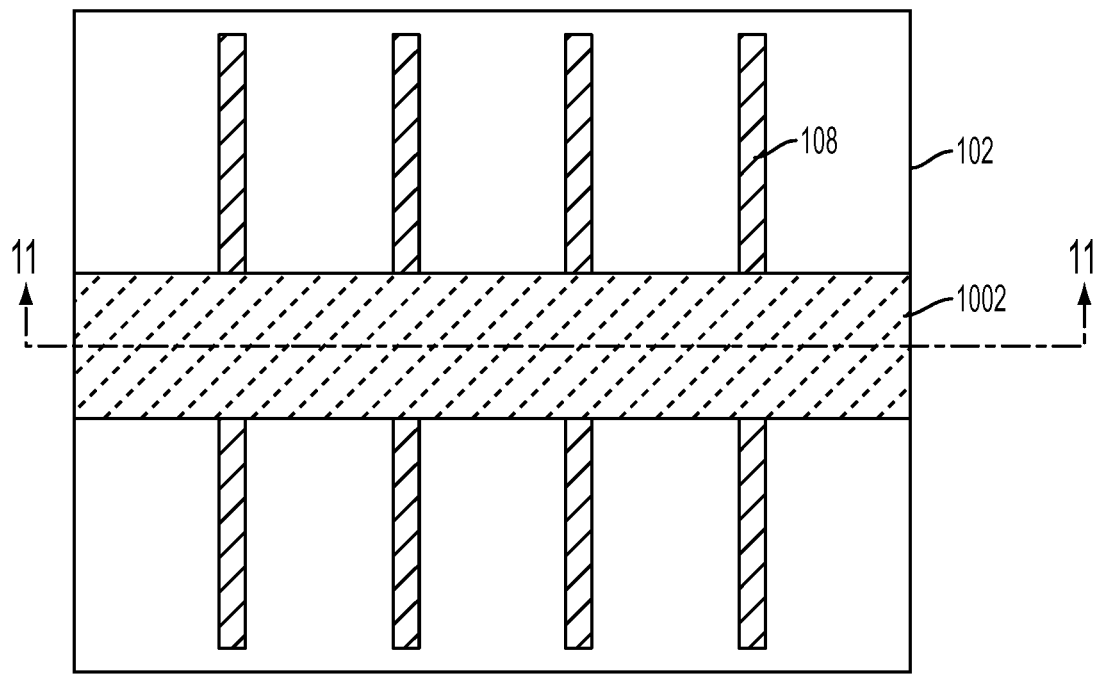
FIG. 10 illustrates a top view of the resultant structure following the formation of a dummy gate stack.
Figure 11:
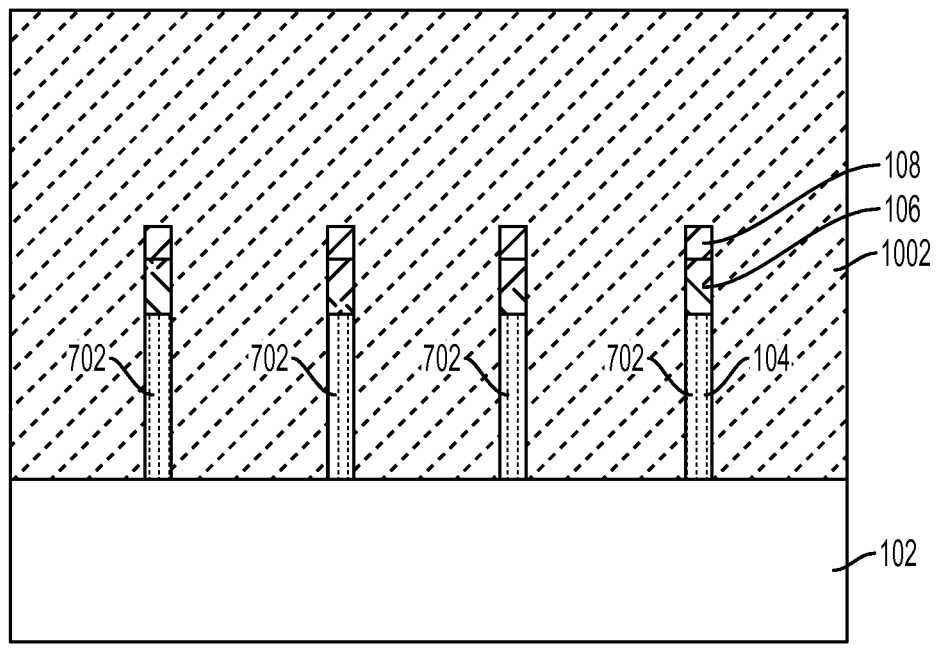
FIG. 11 illustrates a cut-away view along the line 11 (of FIG. 10).

FIG. 10 illustrates a top-view of the resultant structure following the formation of a dummy gate stack 1002 over portions of the fins 702, and FIG. 11 illustrates a cut-away view along the line 11 (of FIG. 10). In this regard, a layer of dummy gate stack material such as, for example, polysilicon, is conformably deposited over the insulator layer 102, along the sides of the fins 702, the sides of the hardmask layer 106, and over the metallic alloy layer 108. The dummy gate stack 1002 is formed by, for example, a photolithographic patterning and etching process.

The etching process that patterns the dummy gate stack 1002 includes an isotropic etching process such as, for example, an RIE process that is selective to remove exposed portions of the dummy gate material while not appreciably removing exposed portions of the metallic alloy layer 108. Thus, the dummy gate stack 1002 may be formed without the use of a thick sacrificial layer of hardmask material layer, due to the use of a relatively thin metallic alloy layer 108 and an etch chemistry that is selective to the metallic alloy layer 108.

Figure 12:
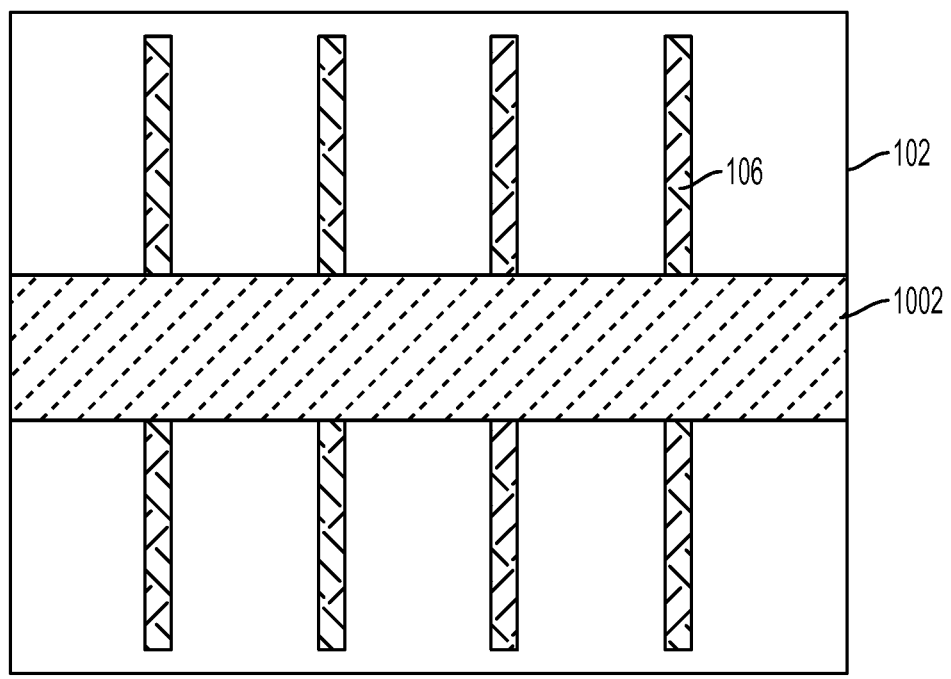
FIG. 12 illustrates a top view of the resultant structure following the removal of exposed portions of the metallic alloy layer.

FIG. 12 illustrates a top-view of the resultant structure following the removal of exposed portions of the metallic alloy layer 108 (of FIG. 10) using, for example, a selective isotropic etching process that removes the exposed portions of the metallic alloy layer 108 and exposes portions of the hardmask layer 106.

Figure 13:
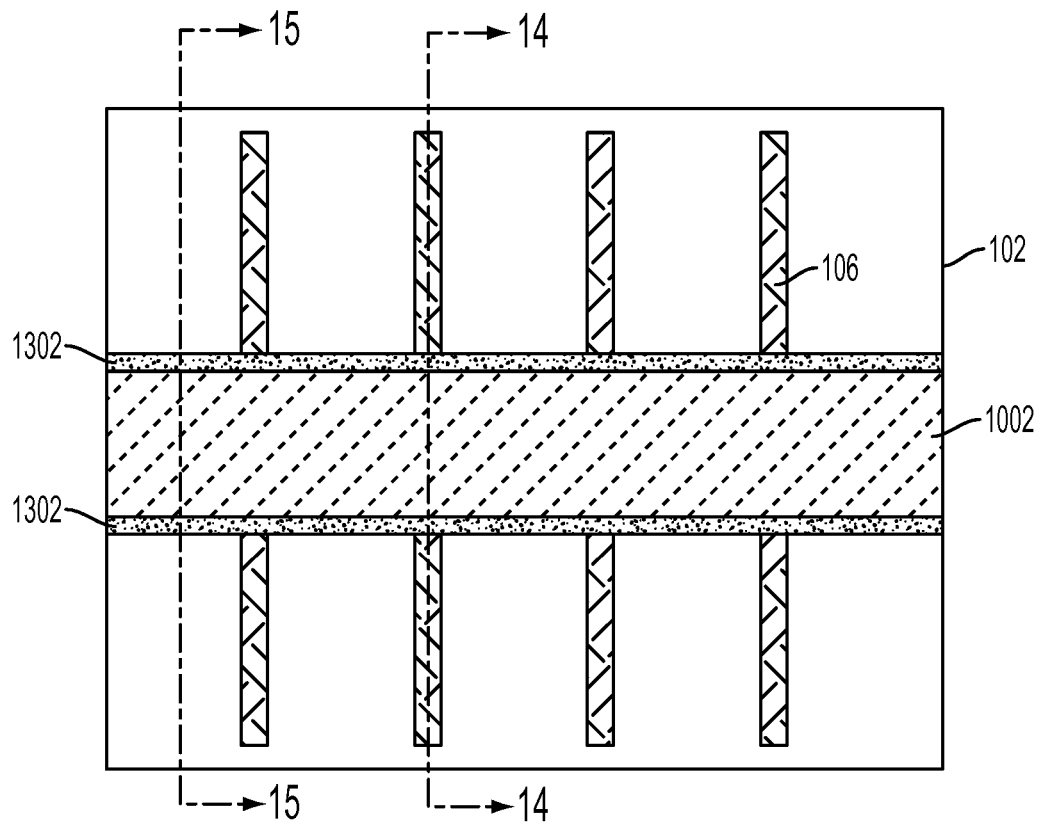
FIG. 13 illustrates a top view of the resultant structure following the formation of spacers along sidewalls of the dummy gate stack.
Figure 14:
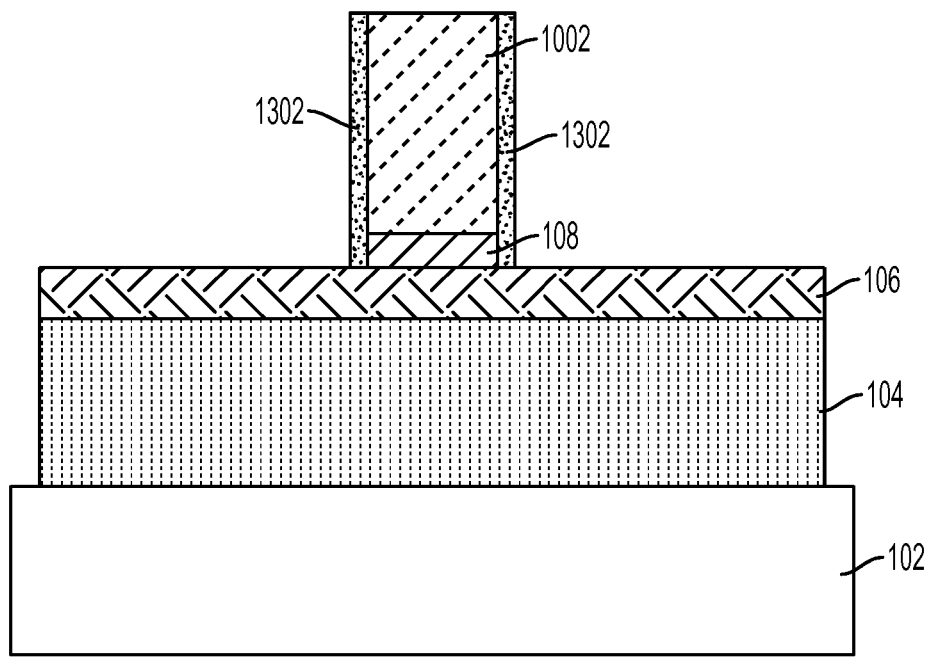
FIG. 14 illustrates a cut-away view along the line 14 (of FIG. 13).
Figure 15:
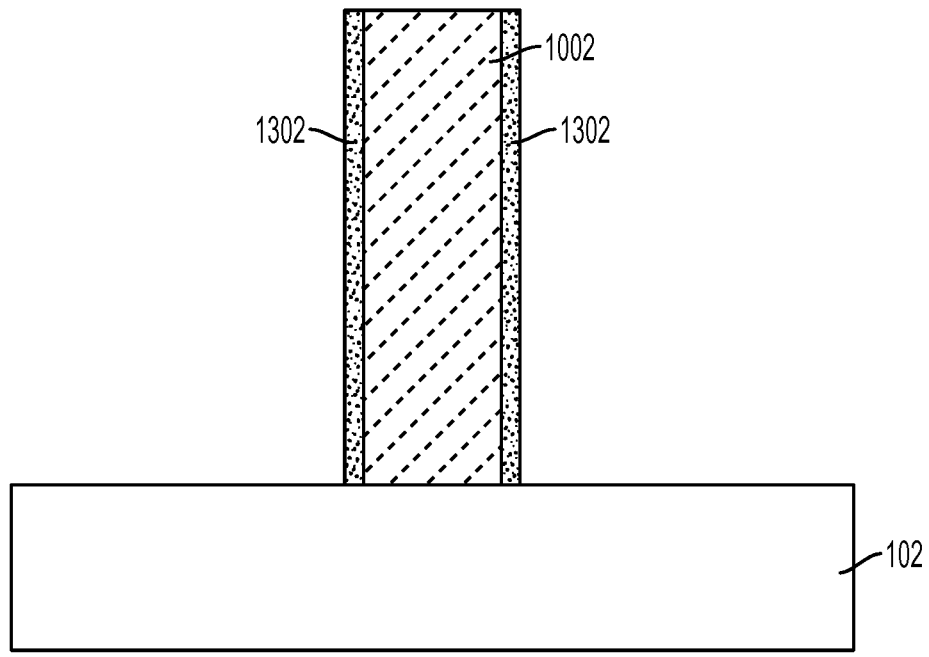
FIG. 15 illustrates a cut-away view along the line 15 (of FIG. 13).

FIG. 13 illustrates a top-view of the resultant structure following the formation of spacers 1302 along sidewalls of the dummy gate stack 1002. FIG. 14 illustrates a cut-away view along the line 14 (of FIG. 13). FIG. 15 illustrates a cut-away view along the line 15 (of FIG. 13). The spacers 1302 may include, for example, an oxide or nitride material. The spacers 1302 may be formed by a material deposition and etching process.

Figure 16A:
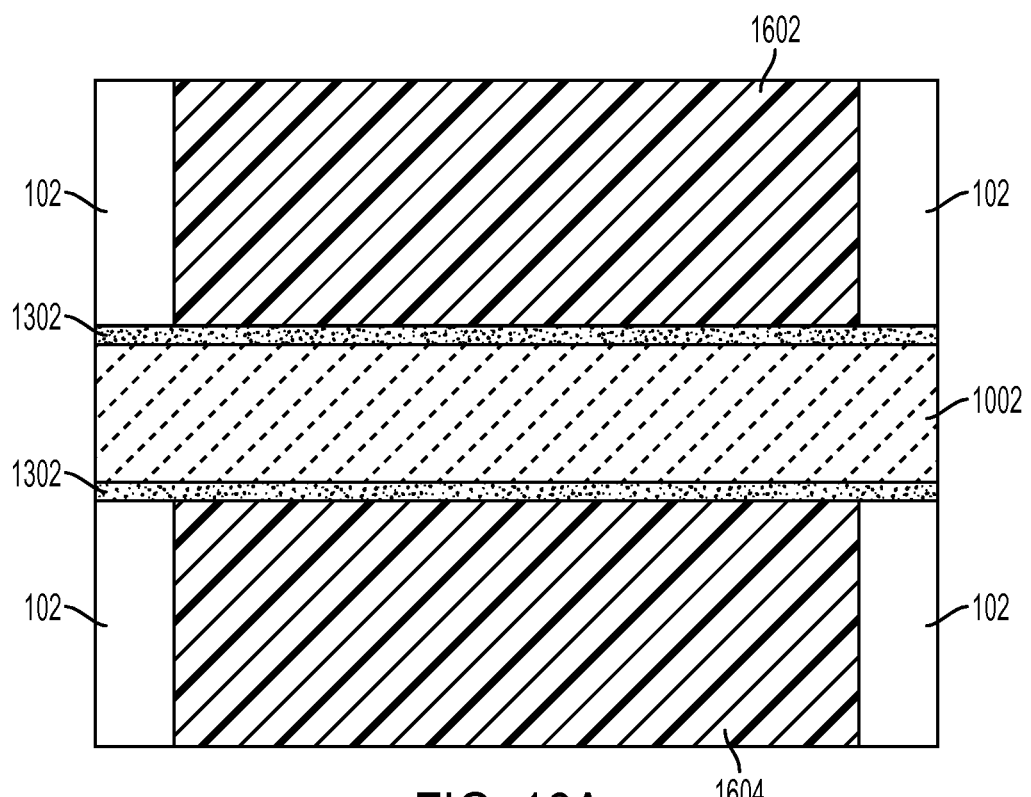
FIG. 16A illustrates a top view of the formation of active regions.

FIG. 16A illustrates a top view of the formation of active regions that include a source region 1602 and a drain region 1604. The source and drain regions 1602 and 1604 may be formed by, for example, an epitaxial growth process that grows an epitaxial semiconductor material such as, for example epi-silicon from the exposed portions of the fins 702 (described above). The source and drain regions 1602 and 1604 may be formed following the removal of exposed portions of the hardmask layer 106 if desired. The source and drain regions 1602 and 1604 may include dopants that may be incorporated in-situ during the epitaxial growth process, or implanted in the source and drain regions 1602 and 1604 using, for example, an ion implantation process performed following the epitaxial growth process that grows, for example, an epi SiGe(B) on the PFET side, epi Si(P) in the nFET side in a complimentary metal oxide semiconductor (CMOS) compatible flow.

Figure 16B:
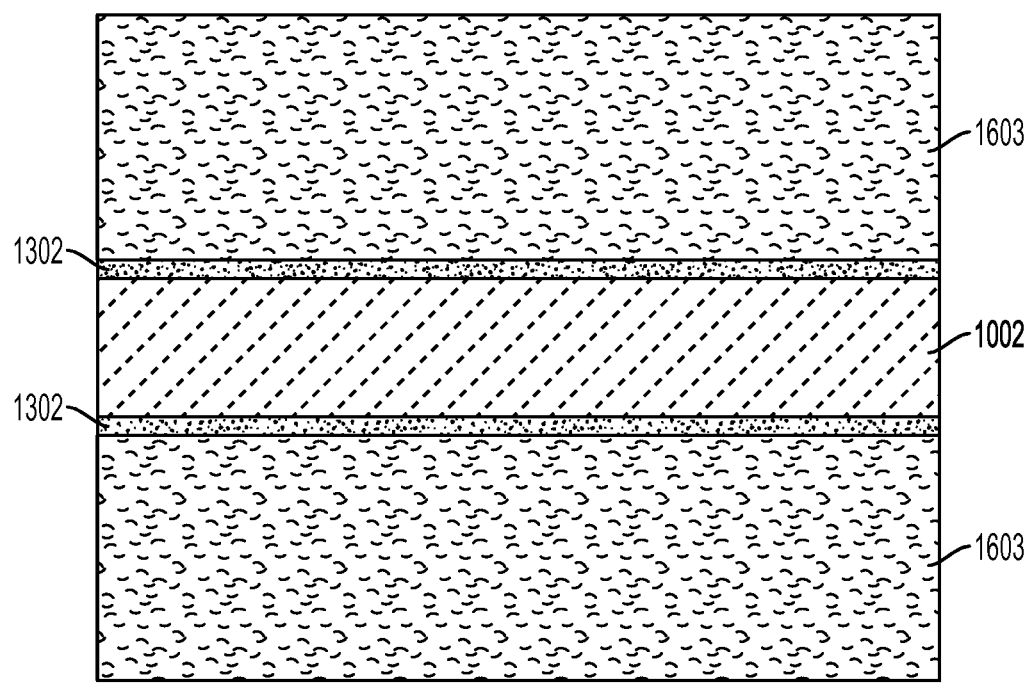
FIG. 16B illustrates a top view of the resultant structure following the deposition of an oxide layer between the gates and planarization of the oxide layer.

FIG. 16B illustrates a top view of the resultant structure following the deposition of an oxide layer 1603 over exposed portions of the source region 1602, the drain region 1604 and the insulator layer 102. Following the deposition of the oxide layer 1603, a planarizing process such as, for example, chemical mechanical polishing (CMP) may be performed to expose the dummy gate stack 1002 and the spacers 1302.

Figure 17:
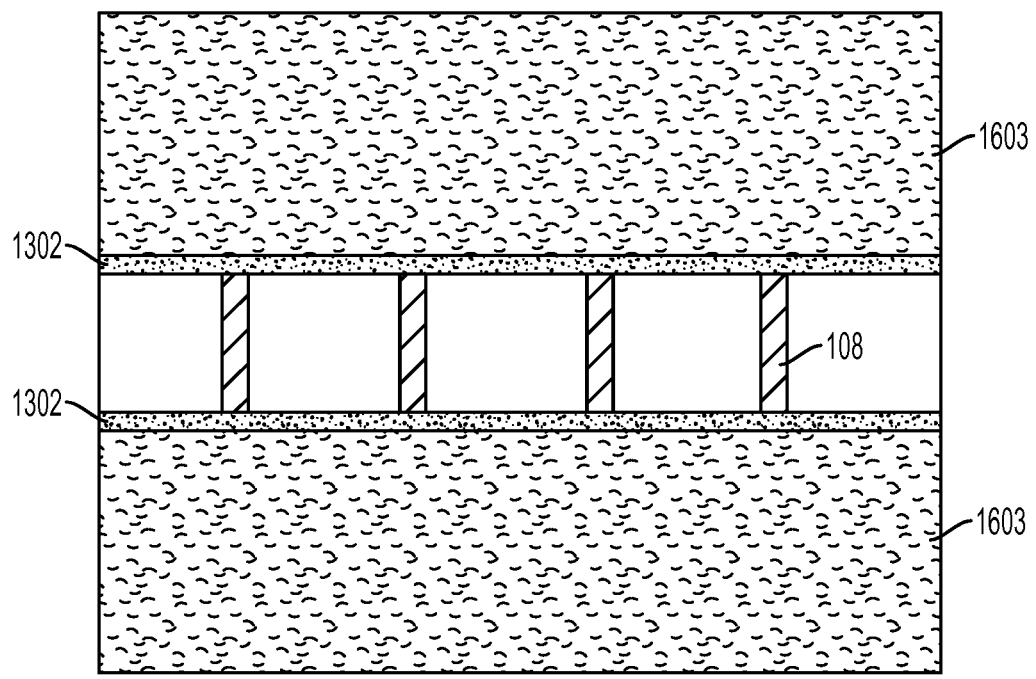
FIG. 17 illustrates a top view of the resultant structure following the removal of the dummy gate stack.
Figure 18:
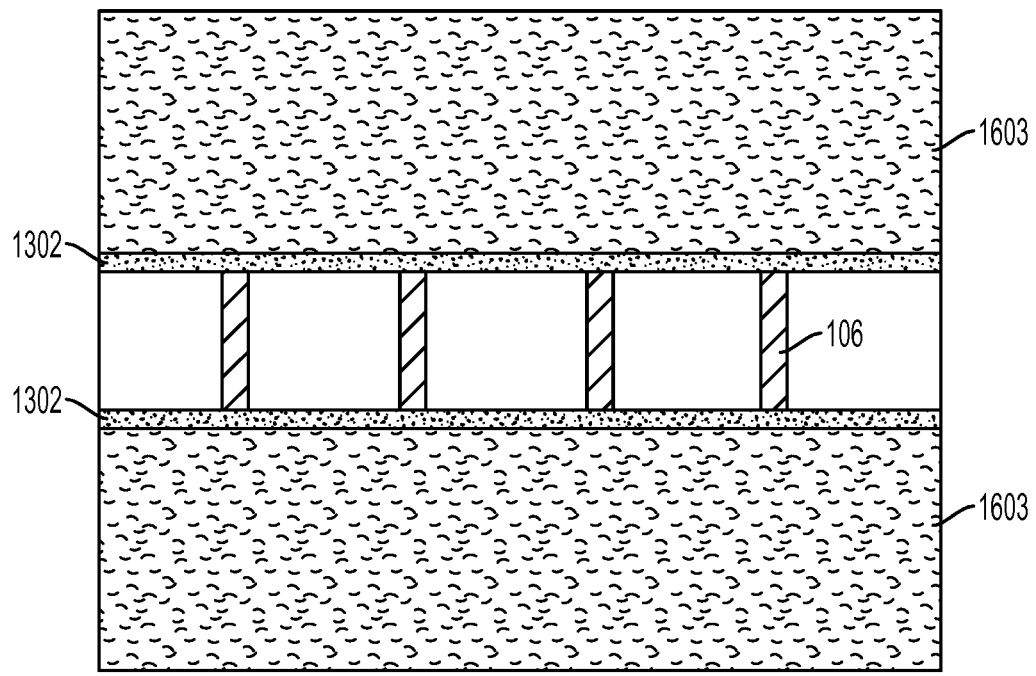
FIG. 18 illustrates a top view of the resultant structure following the removal of the exposed metallic alloy material.

FIG. 17 illustrates a top-view of the resultant structure following the removal of the dummy gate stack 1002 (of FIG. 16), which exposes portions of the metallic alloy material 108. FIG. 18 illustrates a top-view of the resultant structure following the removal of the exposed metallic alloy material 108, which exposes portions of the hardmask layer 106 arranged between the spacers 1302.

Figure 19:
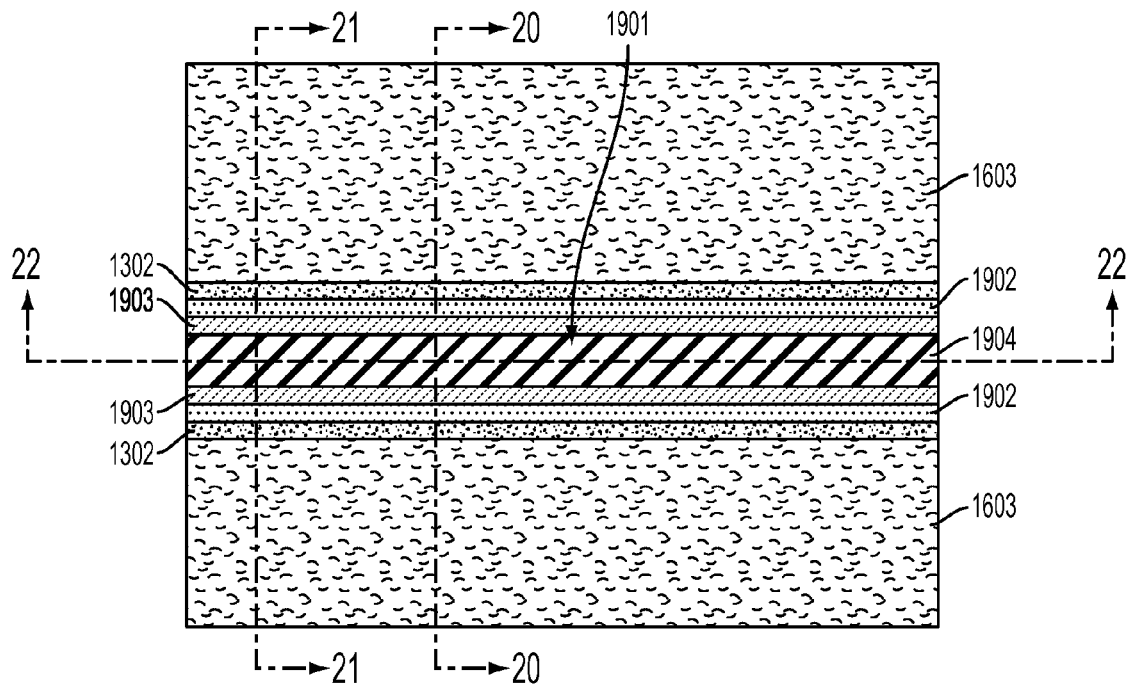
FIG. 19 illustrates a top view of the resultant structure following the formation of a gate stack over the channel region of the fins.
Figure 20:
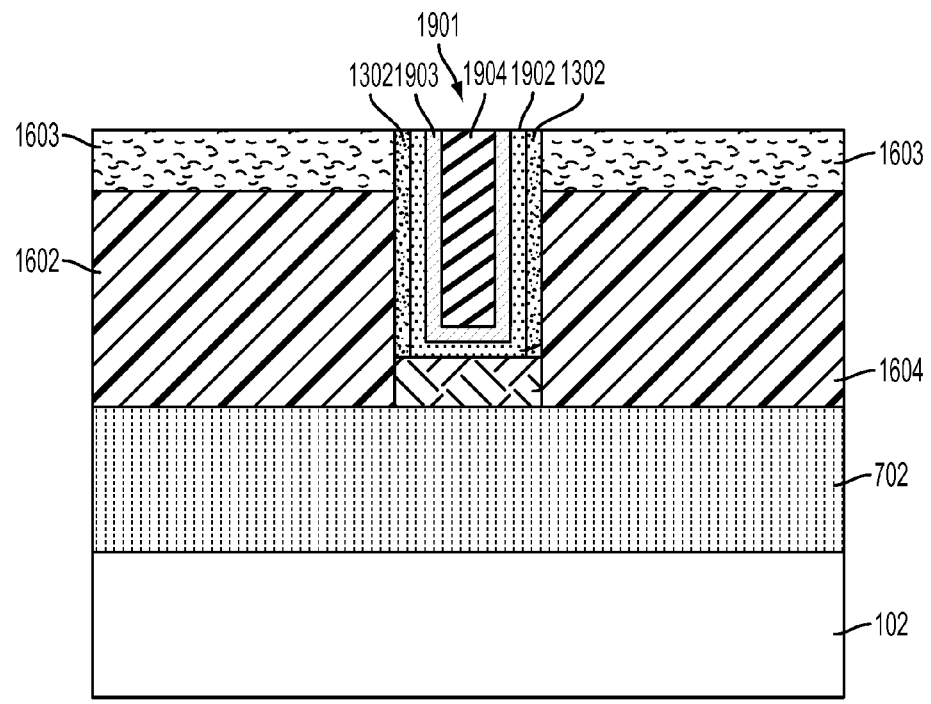
FIG. 20 illustrates a cut away view along the line 20 (of FIG. 19).
Figure 21:
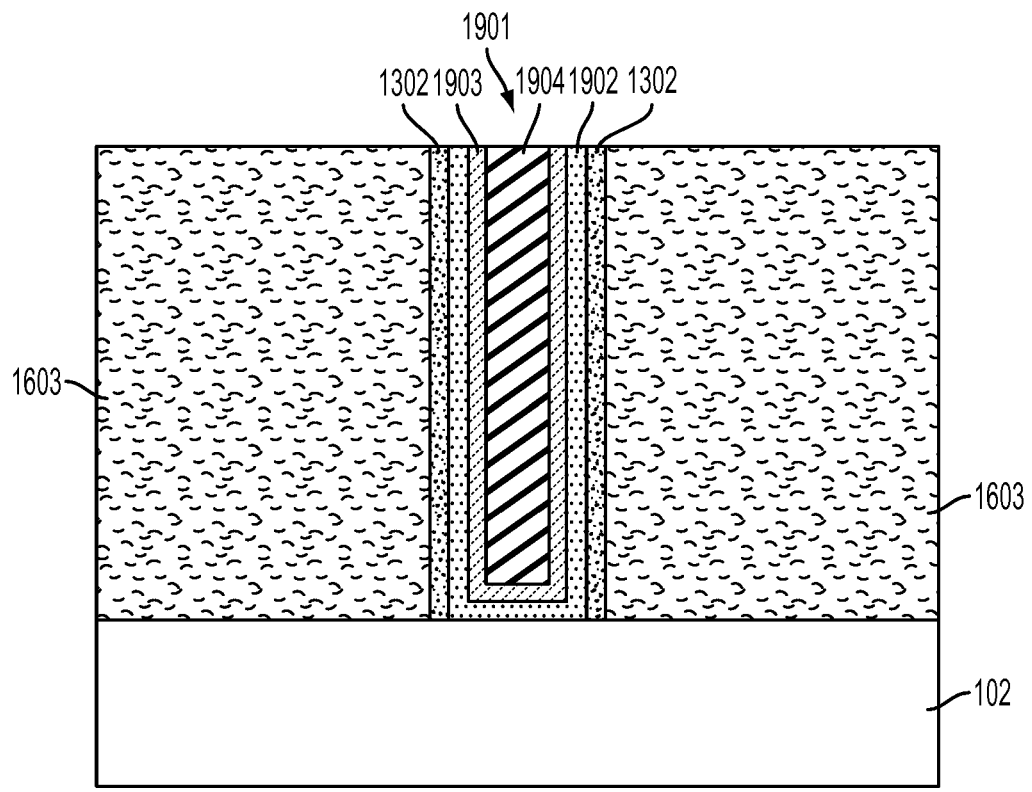
FIG. 21 illustrates a cut away view along the line 21 (of FIG. 19).
Figure 22:
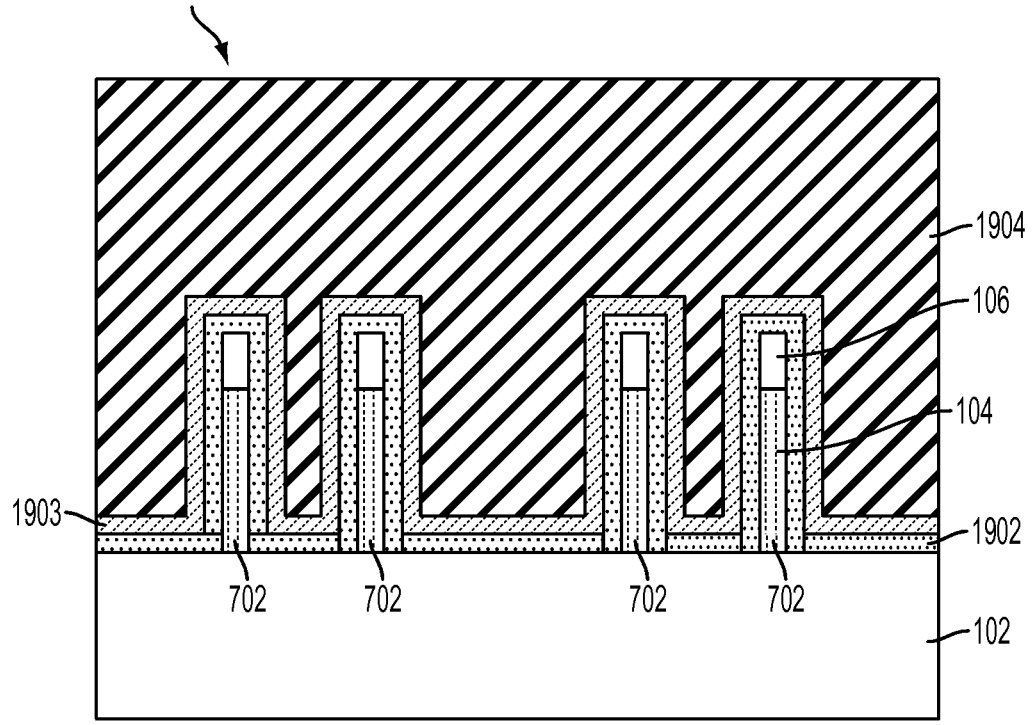
FIG. 22 illustrates a cut away view along the line 22 (of FIG. 19).

FIG. 19 illustrates a top-view of the resultant structure following the formation of a gate stack 1901 over the channel region of the fins 702. FIG. 20 illustrates a cut-away view along the line 20 (of FIG. 19). FIG. 21 illustrates a cut-away view along the line 21 (of FIG. 19). FIG. 22 illustrates a cut-away view along the line 22 (of FIG. 19). The gate stack 1901 includes a dielectric material layer 1902 that may include, for example, a high-K dielectric material disposed over the hardmask layer 106 and exposed sidewalls of the fin 702, and a work function metal layer 1903 disposed over the dielectric material layer 1902. A metallic gate material 1904 is disposed over the gate work function metal layer 1903. A planarizing process such as, for example, CMP may be performed to remove overburden material and defined the gate stack 1901 following the deposition of the gate dielectric material layer 1902, the work function metal layer 1903, and the metallic gate material 1904.

Figure 23:
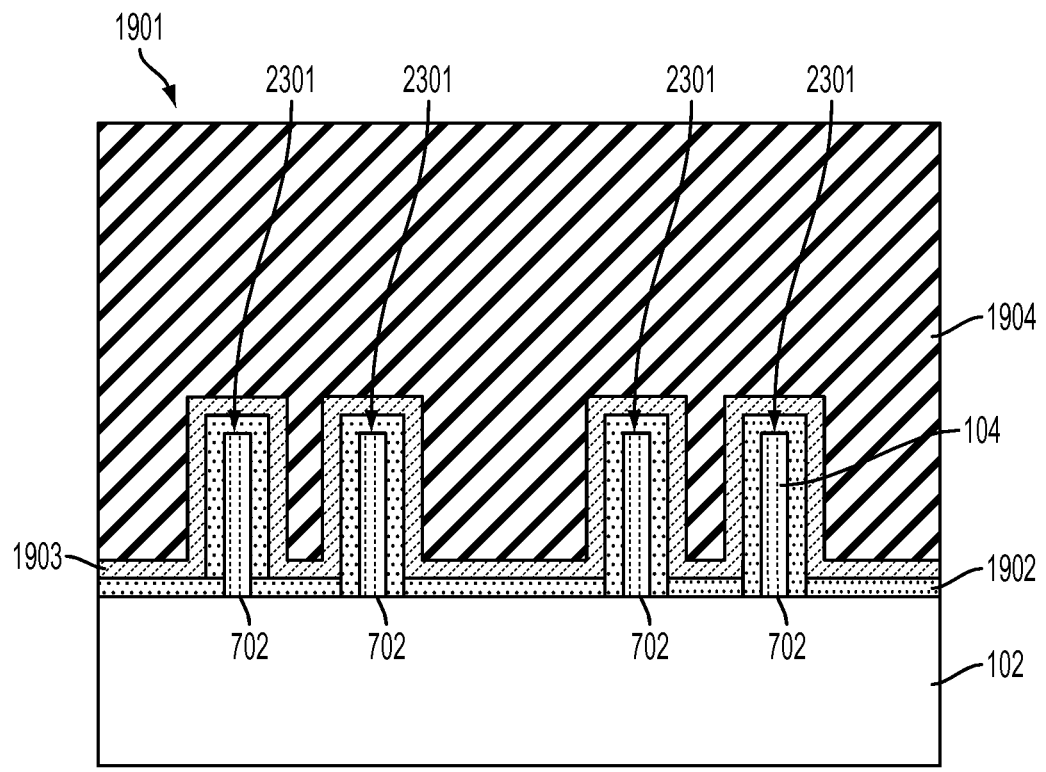
FIG. 23 illustrates an alternate exemplary embodiment of a FinFET device having a tri-gate structure.

FIG. 23 illustrates an alternate exemplary embodiment of a FinFET device having a tri-gate structure. In this regard, FIG. 23 shows a similar perspective as FIG. 22. In the embodiment of FIG. 23, the hardmask layer 108 (of FIG. 18) is removed using a suitable etching process) prior to the formation of the gate stack 1901 such that the gate dielectric material layer 1902 contacts the top surface 2301 of the fins 702.

Figure 24:
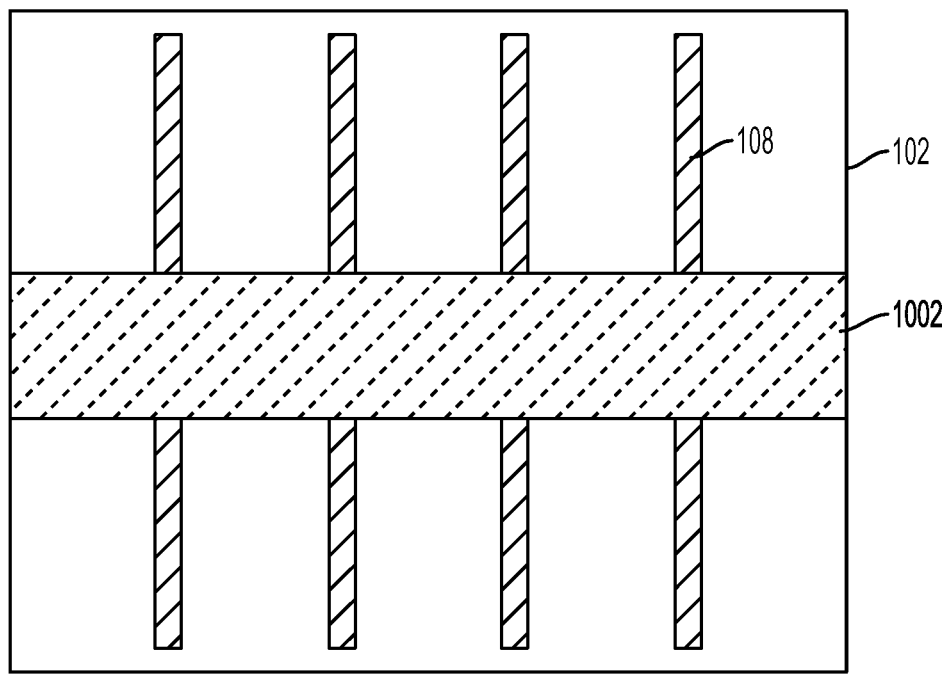
FIG. 24 illustrates a top view of the resultant structure following the formation of a dummy gate stack.

FIGS. 24-31 illustrate an alternate exemplary method and resultant device similar to the methods described above. In this regard, similar processes as described above in FIGS. 1-11 are performed resulting in the dummy gate stack 1002 as shown in FIG. 24.

Figure 25:
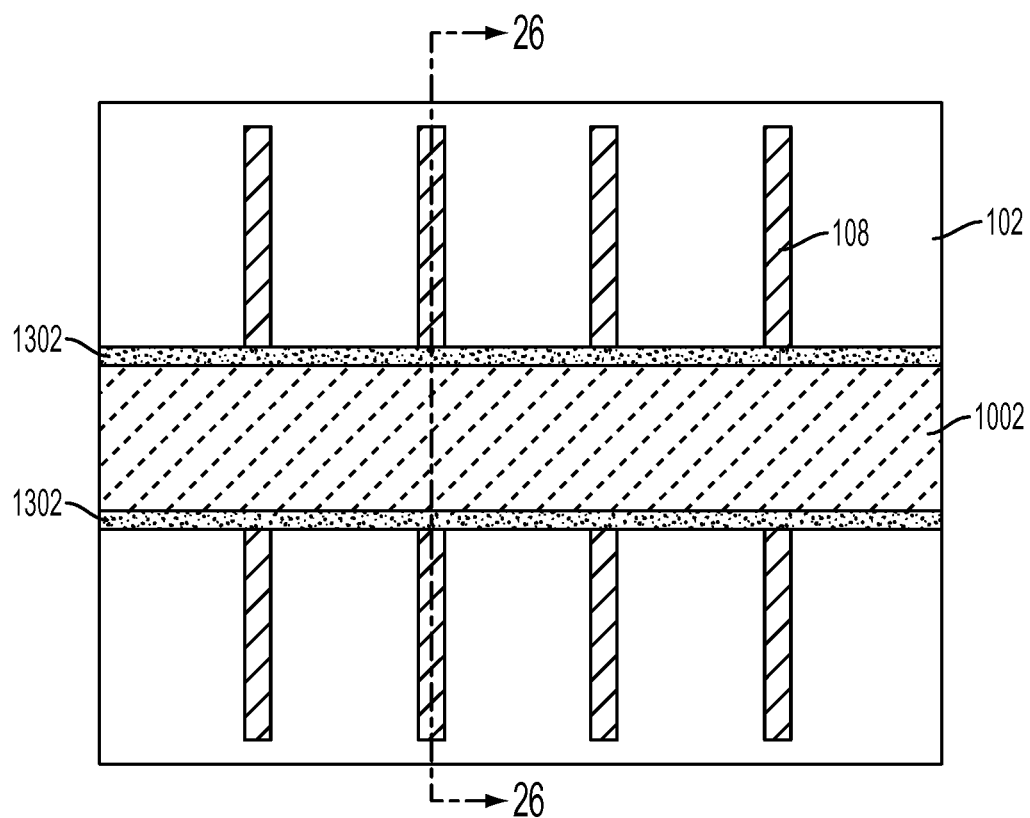
FIG. 25 illustrates the resultant structure following the formation of spacers.
Figure 26:
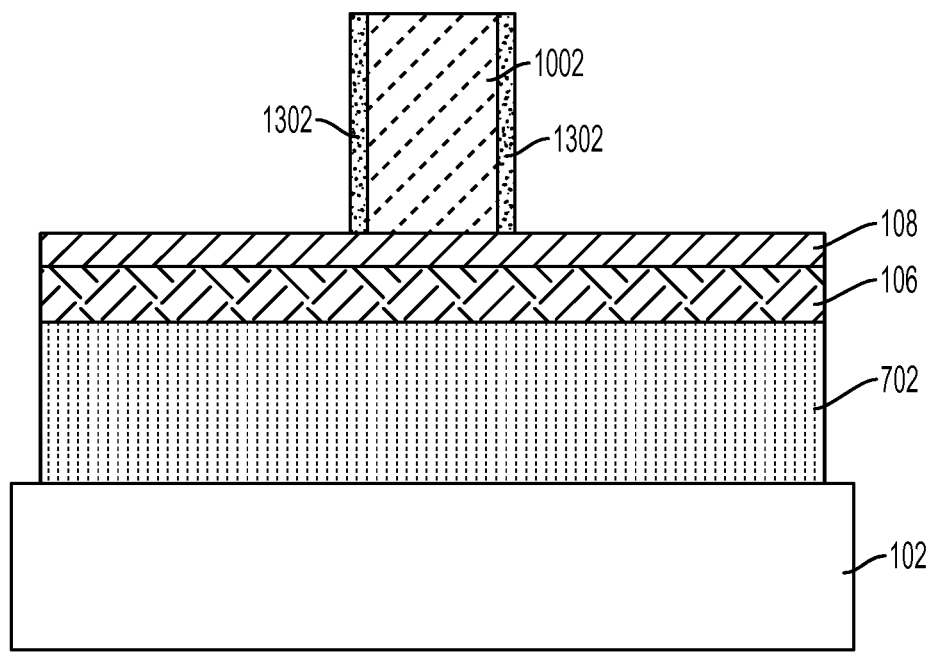
FIG. 26 illustrates a cut-away view along the line 26 (of FIG. 25).

FIG. 25 illustrates the resultant structure following the formation of spacers 1302 in a similar manner as described above in FIG. 13. FIG. 26 illustrates a cut-away view along the line 26 (of FIG. 25). In this regard, the spacers 1302 are formed prior to the removal of the metallic alloy layer 108 such that the spacers 1302 are formed over portions of the metallic alloy material 108.

Figure 27:
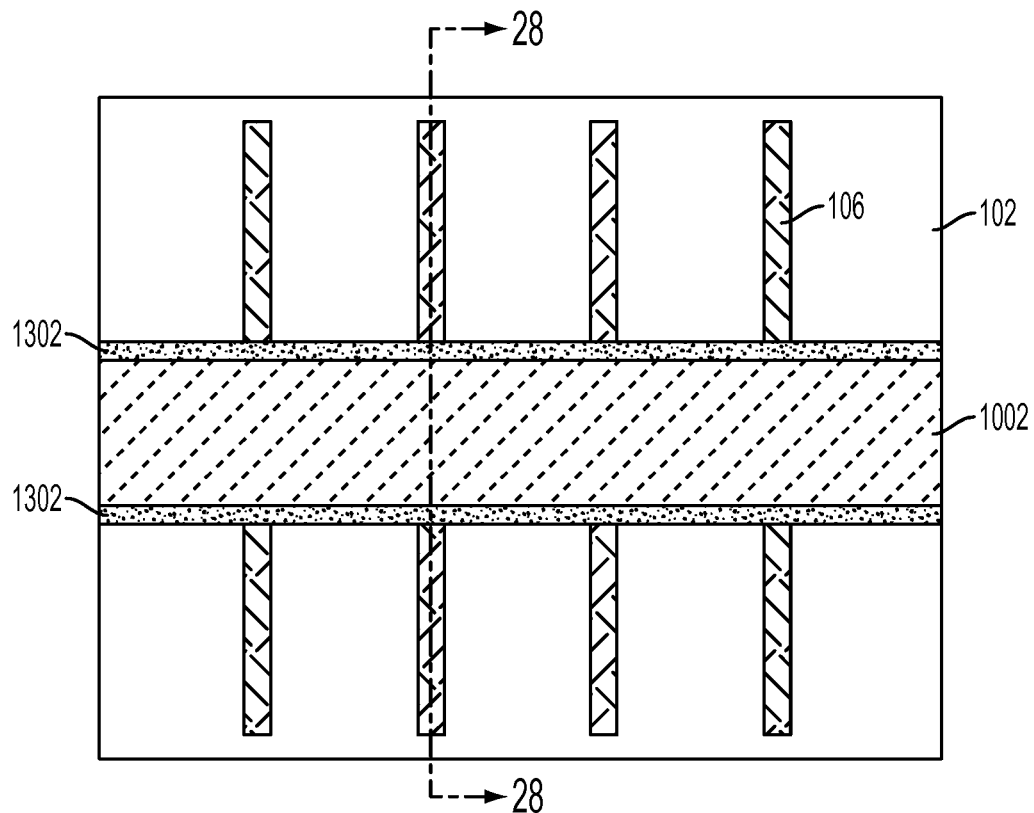
FIG. 27 illustrates the removal of exposed portions of the metallic alloy layer following the formation of the spacers.
Figure 28:
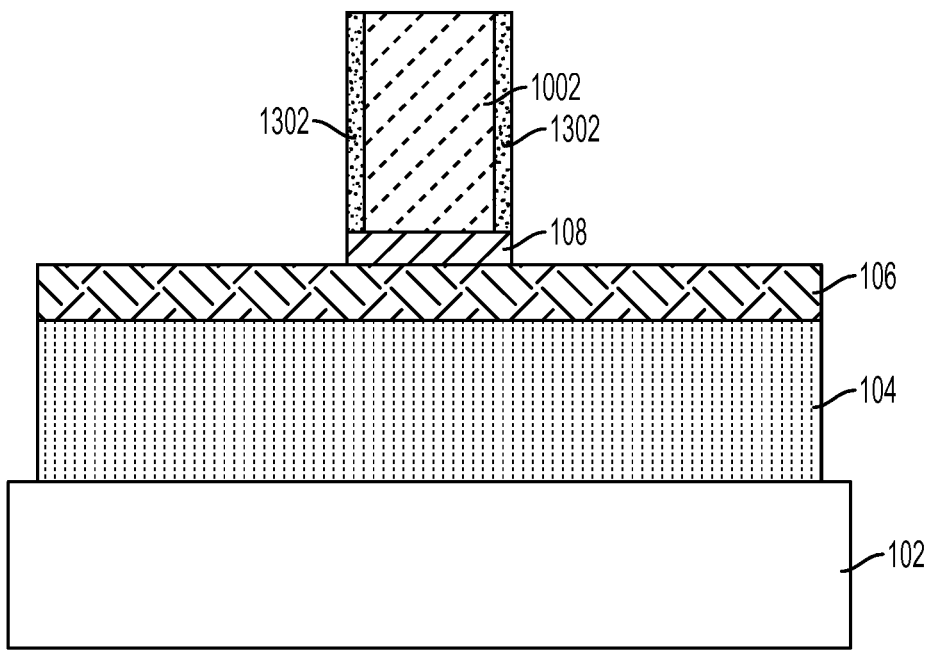
FIG. 28 illustrates a cut-away view along the line 28 (of FIG. 27).

FIG. 27 illustrates the removal of exposed portions of the metallic alloy layer 108 following the formation of the spacers 1302. FIG. 28 illustrates a cut-away view along the line 28 (of FIG. 27).

Figure 29:
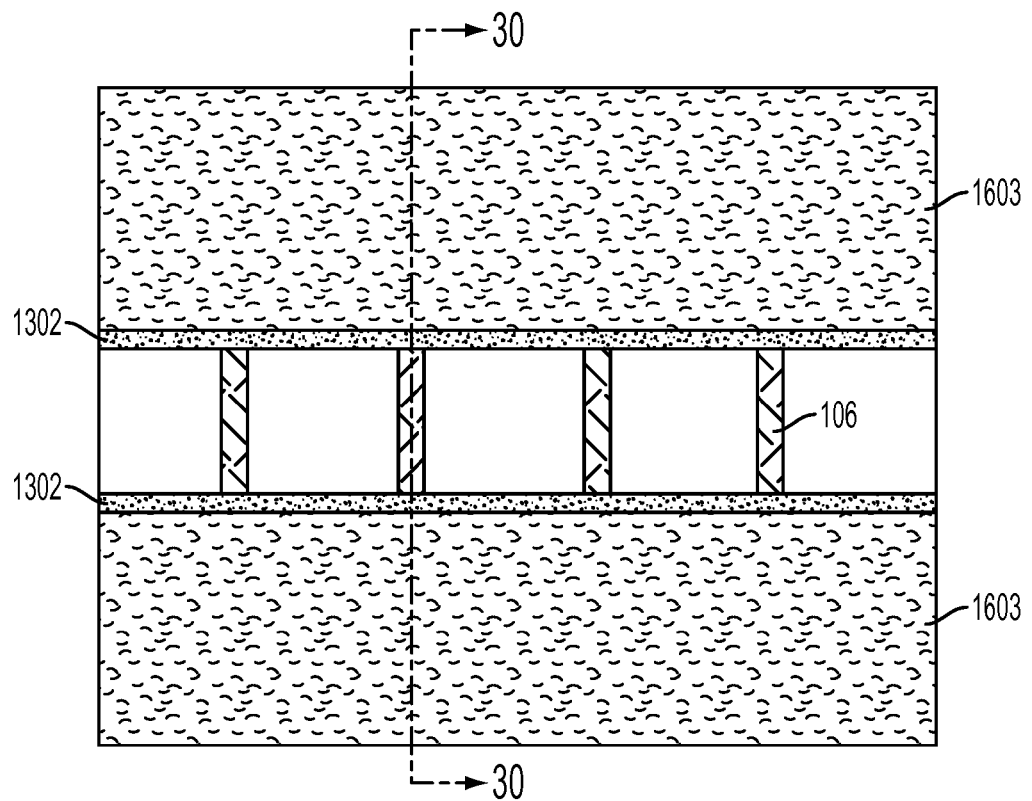
FIG. 29 illustrates resultant structure following the formation of source and drain regions and, the removal of the dummy gate stack, and the removal of exposed portions of the metallic alloy layer.
Figure 30:
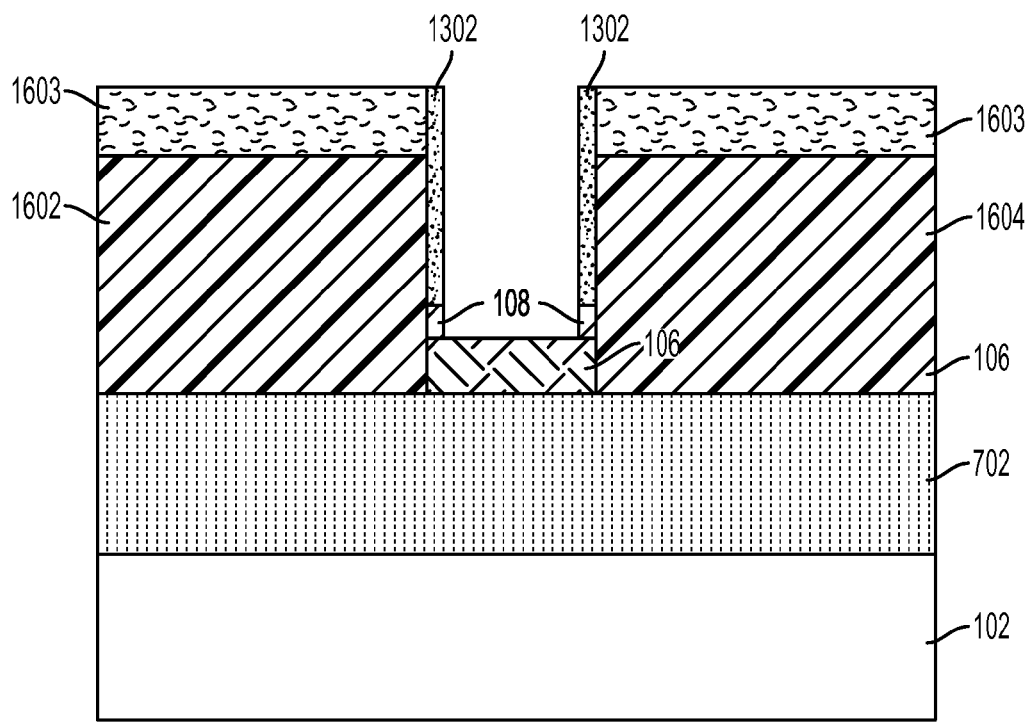
FIG. 30 illustrates a cut-away view along the line 30 (of FIG. 29).

FIG. 29 illustrates resultant structure following the formation of source and drain regions 1602 and 1604, the removal of the dummy gate stack 1002 (of FIG. 28), and the removal of exposed portions of the metallic alloy layer 108 (of FIG. 28) over the channel region of the fins 702. FIG. 30 illustrates a cut-away view along the line 30 (of FIG. 29). The exposed portions of the metallic alloy layer 108 have been removed using an anisotropic etching process. In the embodiments described herein, when the hardmask layer 106 remains over portions of the fins 702 following fabrication of the device, the hardmask layer 106 is formed from an insulating or non-conducting material.

Figure 31:
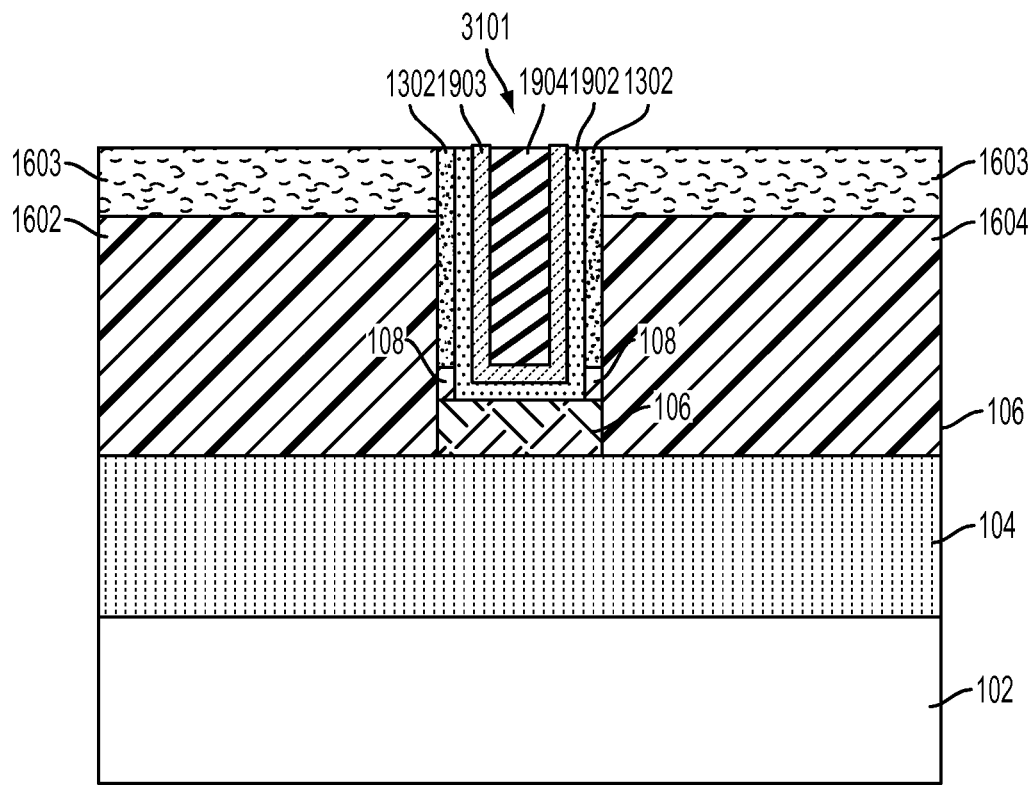
FIG. 31 illustrates the formation of a gate stack.

FIG. 31 illustrates the formation of a gate stack 3101 that includes the dielectric layer 1902 and the gate material layer 1904. Portions of the metallic alloy layer 108 remain disposed over portions of the hardmask layer 106 and are partially covered by the spacers 1302.

Figure 32:
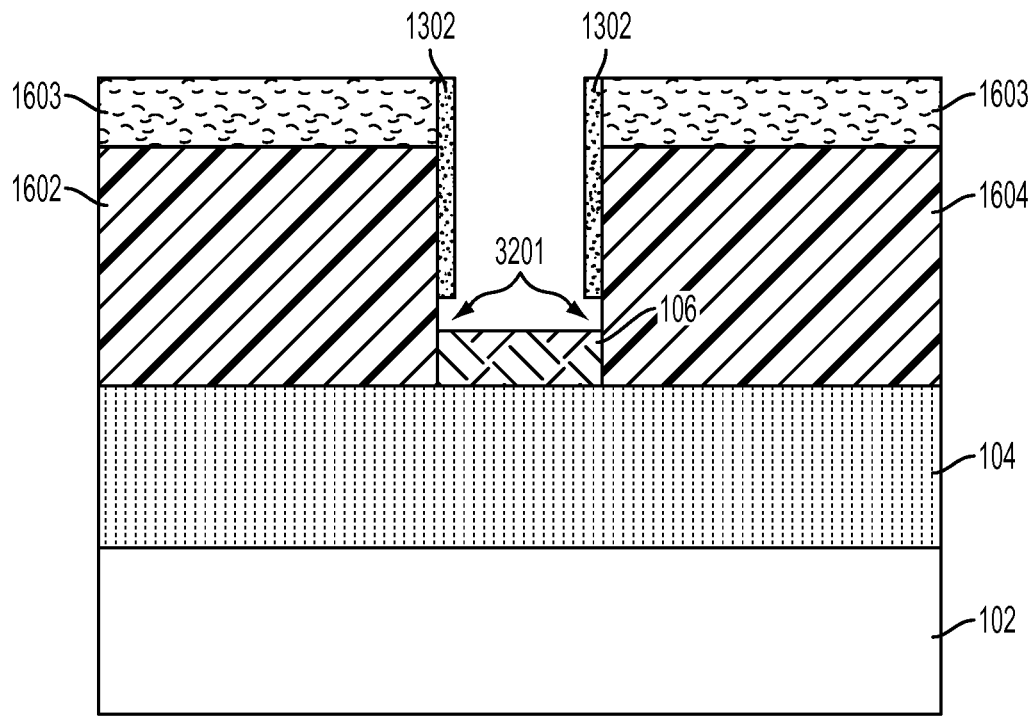
FIG. 32 illustrates the removal of exposed portions of the metallic alloy layer.
Figure 33:
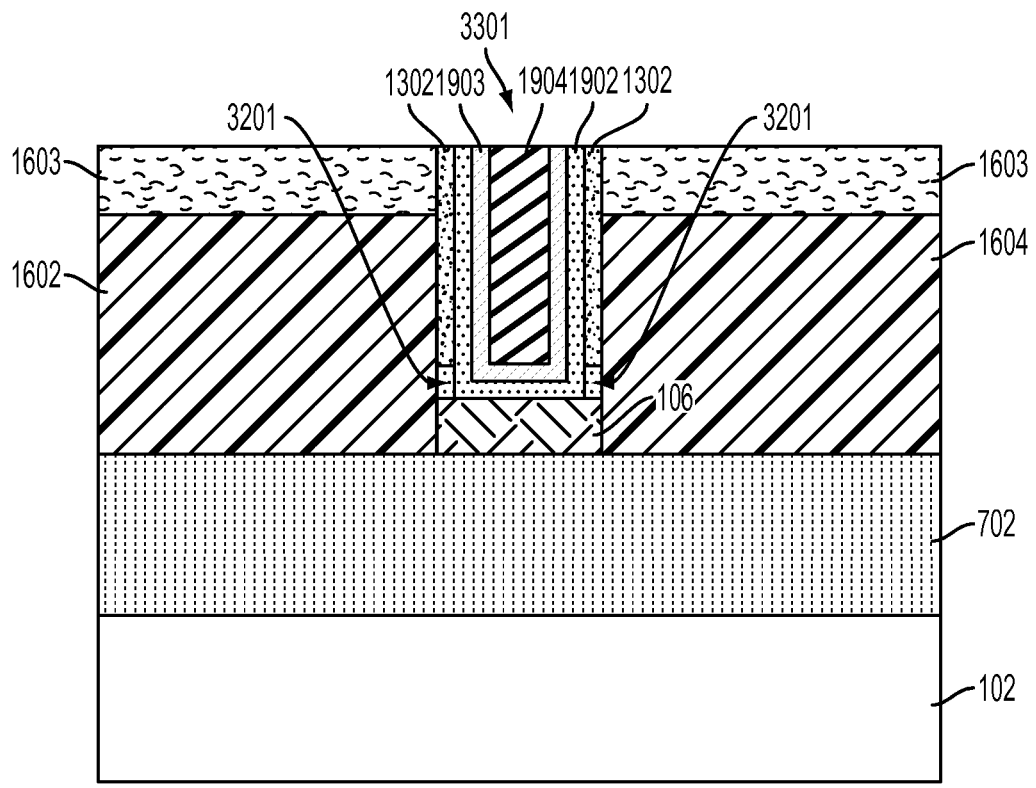
FIG. 33 illustrates the resultant structure following the formation of the gate stack.

FIGS. 32-33 illustrate another exemplary method and resultant structure similar to the methods described above in FIGS. 24-31. In this regard, referring to FIG. 32, following the removal of the dummy gate stack as shown above in FIG. 29, the exposed portions of the metallic alloy layer 108 are removed using an isotropic etching process that results in the formation of cavities 3201 defined by the spacers 1302 the hardmask layer 106, and the respective source and drain regions 1602 and 1604.

FIG. 33 illustrates the resultant structure following the formation of the gate stack 3301. In this regard the cavities 3201 are filled by the gate dielectric material layer 1902.

Figure 34:
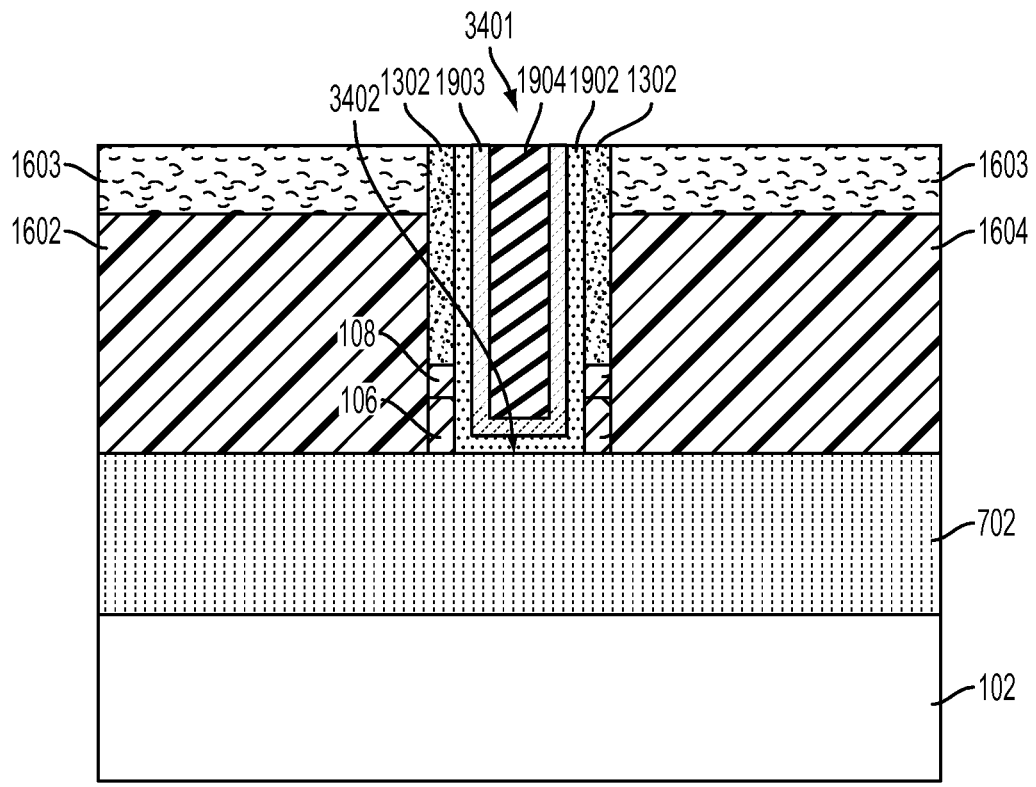
FIG. 34 illustrates another alternate exemplary method and resultant FinFET structure.

FIG. 34 illustrates yet another alternate exemplary method and resultant FinFET structure. In this regard, following the removal of the dummy gate stack 1002 (described above), the exposed portions of the metallic alloy layer 108 and the hardmask layer 106 are removed using an anisotropic etching process that exposes a top surface 3402 of the channel region of the fin 702. A tri-gate gate stack 3401 is formed by depositing the dielectric layer 1902 and metallic gate material 1094 in the cavity previously defined by the dummy gate stack 1002.

Figure 35:
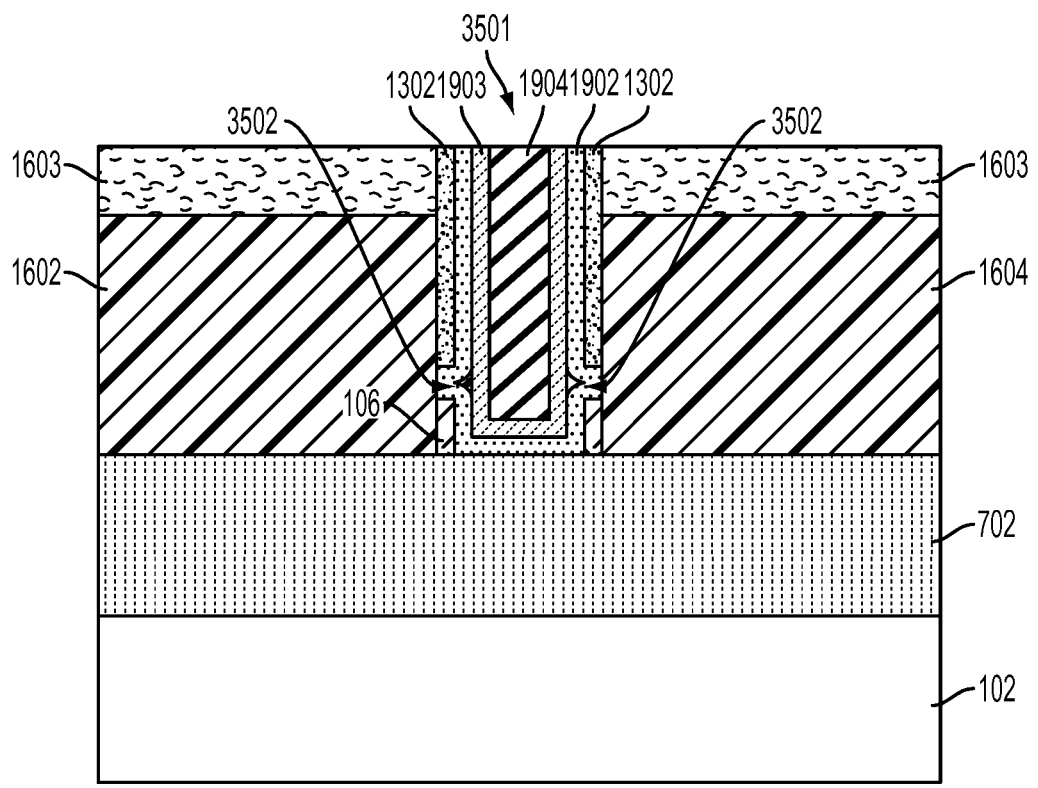
FIG. 35 illustrates another alternate exemplary method and resultant structure.

FIG. 35 illustrates another alternate exemplary method and resultant FinFET structure. In this regard, following the removal of the dummy gate stack 1002 (described above), the exposed portions of the metallic alloy layer 108 are removed using an isotropic etching process that results in cavities 3502 that are defined by the spacer 1302, a portion of the hardmask layer 106, and the respective source and drain regions 1602 and 1604. The exposed portions of the hardmask layer 106 are removed using an anisotropic etching process that exposes a top surface 3402 of the channel region of the fin 702. A tri-gate gate stack 3501 is formed by depositing the dielectric layer 1902 and metallic gate material 1904 in the cavity previously defined by the dummy gate stack 1002.

Figure 36:
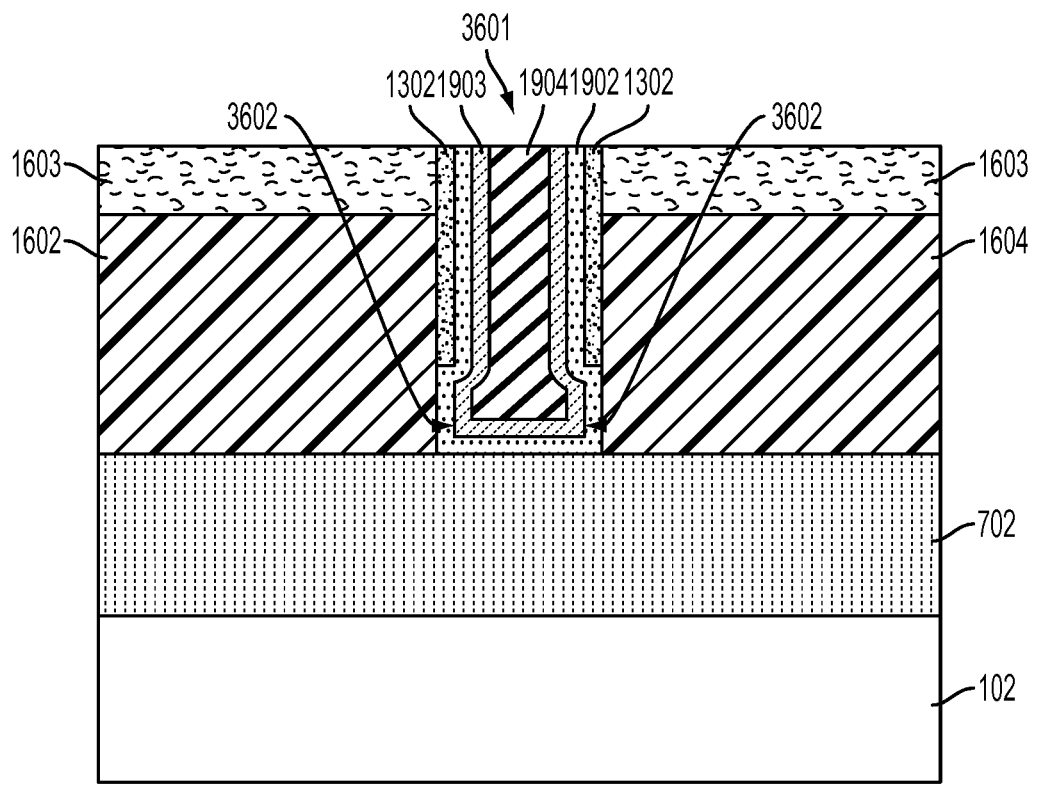
FIG. 36 illustrates another alternate exemplary method and resultant FinFET structure.

FIG. 36 illustrates another alternate exemplary method and resultant FinFET structure. In this regard, following the removal of the dummy gate stack 1002 (described above), the exposed portions of the metallic alloy layer 108 and portions of the hardmask layer 106 are removed using an isotropic etching process that results in cavities 3602 that are defined by the spacer 1302, a portion of the fin 702, and the respective source and drain regions 1602 and 1604. A tri-gate gate stack 3601 is formed by depositing the dielectric layer 1902 and metallic gate material 1904 in the cavity previously defined by the dummy gate stack 1002.

The methods and resultant structures described herein provide a method the fabrication of FinFET devices without using an undesirably thick hardmask layer over the fin structures. The methods also provide for the patterning of high aspect ratio fins for FinFET devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor (FET) device, comprising:
a fin including a semiconductor material arranged on an insulator layer, the fin including a channel region;
a first hardmask portion disposed directly on a top surface of the fin at a first end of the channel region and a second hardmask portion disposed directly on the top surface of the fin at the second end of the channel region, the first hardmask portion and the second hardmask portion being at opposing ends of the channel region and having a gap therebetween;
a first metallic alloy portion disposed directly on the first hardmask portion and a second metallic alloy portion disposed directly on the second hardmask portion, the first metallic portion and the second metallic alloy portion having a gap therebetween;
a gate stack arranged directly on the fin, within the gap between the first hardmask portion and the second hardmask portion, and within the gap between the first metallic alloy portion and the second metallic alloy portion; and
sidewall spacers adjacent sidewalls of the gate stack, wherein bottom surfaces of the sidewall spacers are arranged directly on the first metallic alloy portion and the second metallic alloy portion.

* * * * *